(12) United States Patent
Tran et al.

(10) Patent No.: US 12,047,068 B2
(45) Date of Patent: Jul. 23, 2024

(54) OUTPUT BUFFER CIRCUIT

(71) Applicant: GlobalFoundries U.S. Inc., Malta, NY (US)

(72) Inventors: Dzung T. Tran, Austin, TX (US); Shivraj G. Dharne, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/080,378

(22) Filed: Dec. 13, 2022

(65) Prior Publication Data

US 2024/0195419 A1  Jun. 13, 2024

(51) Int. Cl.
*H03K 19/01* (2006.01)
*H03K 19/003* (2006.01)
*H03K 19/0185* (2006.01)

(52) U.S. Cl.
CPC ........... *H03K 19/018521* (2013.01); *H03K 19/00315* (2013.01); *H03K 19/00361* (2013.01)

(58) Field of Classification Search
CPC ......... G06F 3/00; G06F 3/1295; H03K 5/003; H03K 19/0175; H03K 19/018521
USPC .......................................................... 327/333
See application file for complete search history.

(56) References Cited

U.S. PATENT DOCUMENTS

| 6,040,729 | A | 3/2000 | Sanchez et al. | |
|---|---|---|---|---|
| 8,536,925 | B2* | 9/2013 | Bhattacharya | H03K 3/0375 327/333 |
| 2006/0091907 | A1* | 5/2006 | Khan | H03K 3/356113 326/81 |
| 2007/0159218 | A1 | 7/2007 | Srinivas et al. | |
| 2008/0252354 | A1* | 10/2008 | Koto | H03K 19/018521 327/321 |
| 2018/0241392 | A1* | 8/2018 | Singh | H03K 19/018507 |

OTHER PUBLICATIONS

Shih-Lun Chen et al., "An Output Buffer for 3.3-V applications in a 0.13-μm 1/2.5-V CMOS process", IEEE Transactions on Circuits and Systems—II: Express Briefs, vol. 54, No. 1, Jan. 2007, DOI:10.1109/TCSII.2006.883202, 6 pages.

* cited by examiner

*Primary Examiner* — Quan Tra
(74) *Attorney, Agent, or Firm* — David Cain; Andrew M. Calderon; Calderon Safran & Wright, PC

(57) ABSTRACT

The present disclosure relates to a structure including a level shifter circuit which receives an input signal and at least one voltage reference signal and outputs at least one level shifted output signal, a pre-driver circuit which receives the at least one level shifted output signal and outputs at least one pre-driver output signal, the pre-driver circuit including at least one delay circuit, and a main driver circuit which receives the at least one pre-driver output signal and outputs a main driver output signal.

14 Claims, 4 Drawing Sheets

OUTPUT BUFFER CIRCUIT

BACKGROUND

The present disclosure relates to an output buffer circuit and, more particularly, to a general-purpose input/output (GPIO) output buffer circuit and methods of manufacture and operation.

A laterally diffused metal-oxide semiconductor (LDMOS) is a planar double-diffused MOSFET (metal-oxide-semiconductor field-effect transistor) used in amplifiers, including microwave power amplifiers, RF power amplifiers, and audio power amplifiers. These transistors are often fabricated on p/p$^+$-silicon epitaxial layers. The fabrication of LDMOS devices mostly involves ion-implantation and subsequent annealing cycles. As an example, a drift region of a power MOSFET is fabricated using up to three ion implantation sequences in order to achieve the appropriate doping profile needed to withstand high electric fields.

In known output buffer design, separate level shifters and pre-driver pairs are required for p-channel field effect transistor (PFET) drivers and n-channel field effect transistor (NFET) drivers. In known output buffer design, these separate level shifters and pre-driver pairs provide for a duty adjustment cycle for a GPIO output buffer. However, known output buffer design in this configuration have leakage issues and an increased area size due to the separate level shifters and pre-driver pairs for the PFET and NFET drivers.

SUMMARY

In an aspect of the disclosure, a structure comprises: a level shifter circuit which receives an input signal and at least one voltage reference signal and outputs at least one level shifted output signal, a pre-driver circuit which receives the at least one level shifted output signal and outputs at least one pre-driver output signal, the pre-driver circuit includes at least one delay circuit, and a main driver circuit which receives the at least one pre-driver output signal and outputs a main driver output signal.

In an aspect of the disclosure, a circuit comprises: a first set of transistors which receives an input signal and at least one voltage reference signal and outputs at least one level shifted output signal, a second set of transistors which receives one of the at least one level shifted output signal and outputs at least one pre-driver output signal, at least one delay circuit connected to the second set of transistors, and a third set of transistors which receives one of the at least one pre-driver output signal and outputs a main driver output signal.

In an aspect of the disclosure, a method comprises: performing a level shifting operation of an output buffer circuit to level shift an input to the output buffer circuit, performing a pre-driving operation of the output buffer circuit to delay the level shifted input; and performing a main driving operation of the output buffer circuit to output a main driver output signal based on the delayed level shifted input.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to an output buffer circuit and, more particularly, to a general-purpose input/output (GPIO) output buffer circuit and methods of manufacture and operation. In the present disclosure, a pre-driver circuit is included for a 5-volt output buffer. In particular, the present disclosure includes PFET and NFET pass devices in the pre-driver circuit. Further, in the present disclosure, a high voltage GPIO output buffer circuit uses a same level-shifter and pre-driver for both PFET and NFET drivers. In contrast, known circuits includes separate paths for PFET and NFET drivers.

Advantageously, in embodiments of the present disclosure, the GPIO output buffer circuit allows for a smaller area and lower leakage output buffer with just one level-shifter and pre-driver for both pull-up and pull-down paths. In particular, in comparison to known circuits, the GPIO output buffer circuit may have a 35% smaller area and 5 times lower leakage output buffer.

The output buffer circuit of the present disclosure may be manufactured in several ways using a number of different tools. In general, though, the methodologies and tools are used to form structures with dimensions in the micrometer and nanometer scale. The methodologies, i.e., technologies, employed to manufacture the output buffer circuit of the present disclosure have been adopted from integrated circuit (IC) technology. For example, the structures are built on wafers and are realized in films of material patterned by photolithographic processes on the top of a wafer. In particular, the fabrication of the output buffer circuit use three basic building blocks: (i) deposition of thin films of material on a substrate, (ii) applying a patterned mask on top of the films by photolithographic imaging, and (iii) etching the films selectively to the mask.

Figure 1:
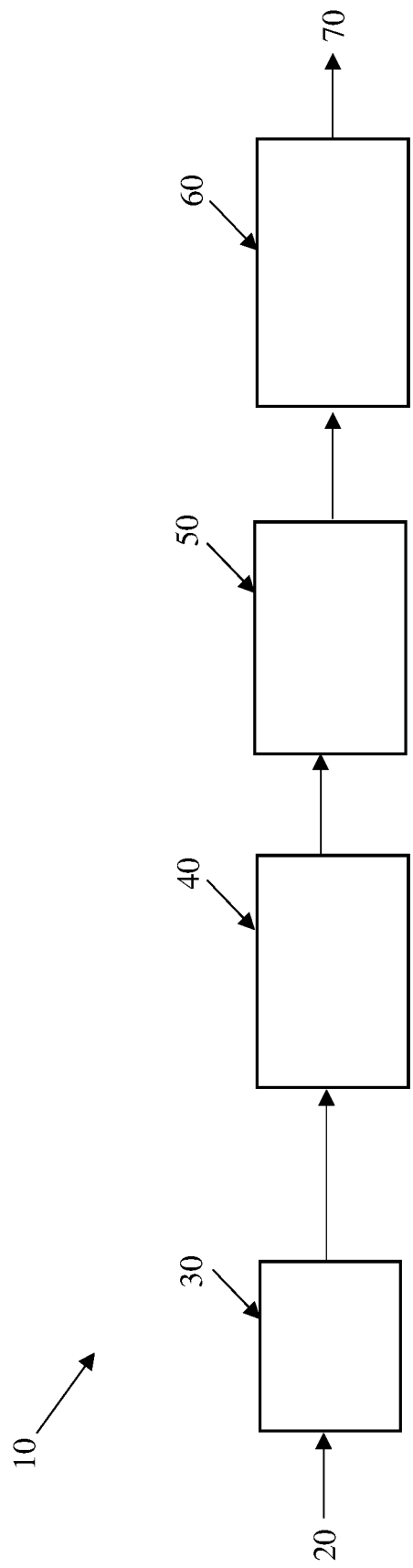
FIG. 1 shows a diagram of an output buffer circuit in accordance with aspects of the present disclosure.

FIG. 1 shows a diagram of an output buffer circuit in accordance with aspects of the present disclosure. In FIG. 1, a block diagram 10 receives data 20 at a control logic circuit 30. After the control logic circuit 30 performs circuit operations, the control logic circuit 30 outputs at least one core circuit output signal to a level shifter circuit 40. The level shifter circuit 40 performs level shifter circuit operations and then outputs at least one level shifter output signal to a pre-driver circuit 50. The pre-driver circuit 50 performs pre-driver circuit operations including a delay adjustment and then outputs at least one pre-driver output signal to a main driver circuit 60. After the main driver circuit 60 performs main driver circuit operations, the main driver circuit 60 outputs at least one main driver output signal 70 to a contact pad of an integrated circuit.

Accordingly, the output buffer circuit of the present disclosure has a single path which allows for lower leakage with a smaller circuit area than known circuits. Further details of the configuration and operations of the level shifter circuit 40, the pre-driver circuit 50, and the main driver circuit 60 will be explained in more detail in the description of FIG. 2 below. In contrast, known circuits include a separate level shifter, pre-driver, and main driver for a PFET driver and a NFET driver.

Figure 2:
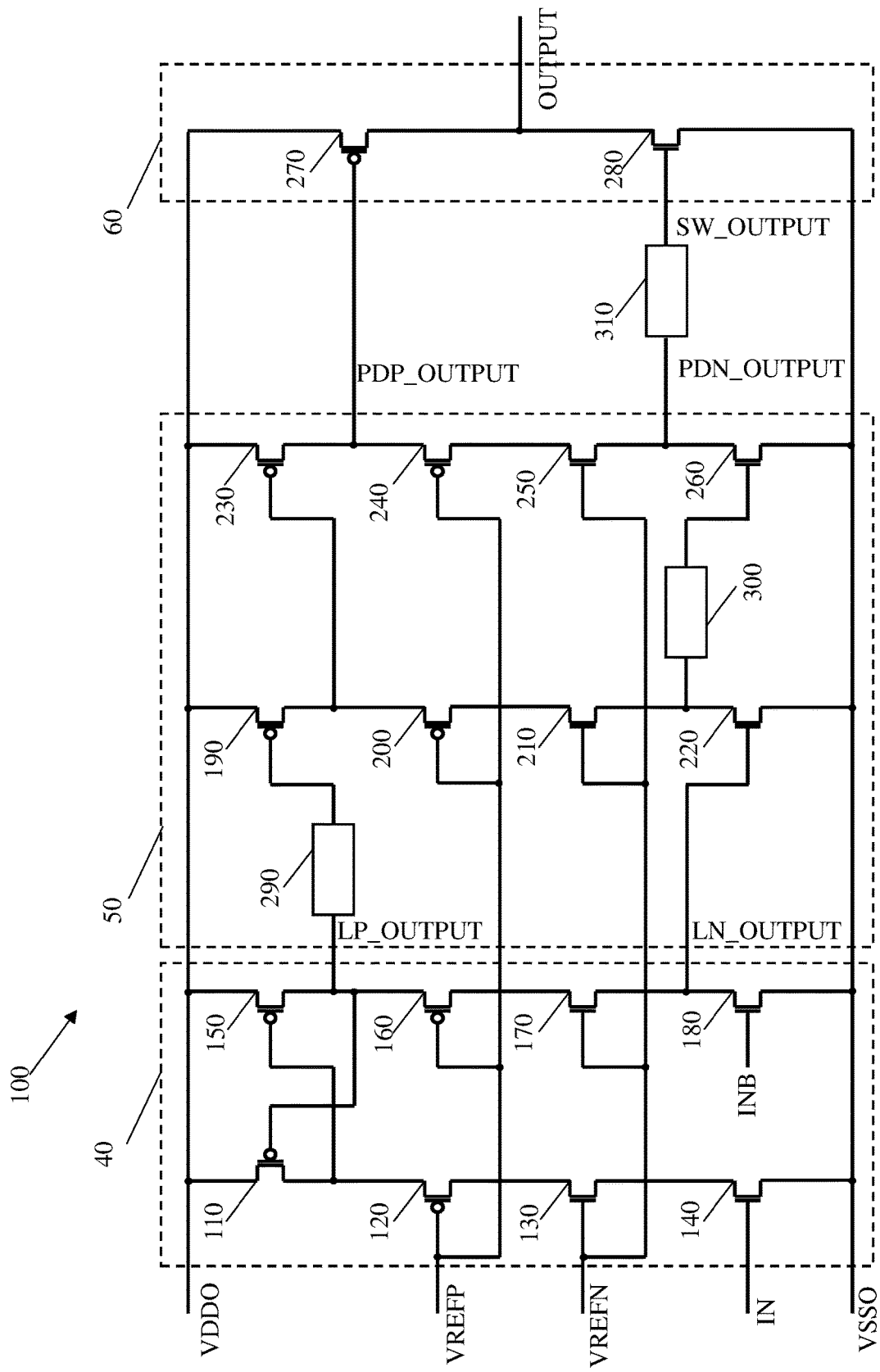
FIG. 2 shows a circuit schematic of the output buffer circuit in accordance with aspects of the present disclosure.

FIG. 2 shows a circuit schematic of the output buffer circuit in accordance with aspects of the present disclosure. The circuit schematic 100 of FIG. 2 includes the level shifter circuit 40, the pre-driver circuit 50, the main driver circuit 60, and a switch circuit 310. In embodiments, the switch circuit 310 may be used to tristate an output buffer.

The level shifter circuit 40 of FIG. 2 receives a first supply voltage VDDO, a second supply voltage VSSO, a voltage reference PFET signal VREFP, a voltage reference NFET signal VREFN, and an input signal IN. In embodiments, the first supply voltage VDDO may be 5.0 volts and the input signal IN may be in a range between 0 volts and 0.8 volts; although these inputs should not be considered a limiting feature of the present disclosure and other embodiments are contemplated herein. The level shifter circuit 40 also includes transistors 110, 120, 130, 140, 150, 160, 170, and 180. The transistors 110, 120, 150, and 160 may be PFETs, while the transistors 130, 140, 170, and 180 may be NFETs although embodiments are not limited to these implementations.

In FIG. 2, the transistors 110 and 150 of the level shifter circuit 40 each have a source which is connected to the first supply voltage VDDO. Transistor 110 has a gate connected to a drain of transistor 150 and a drain connected to a source of transistor 120. Transistor 150 has a gate connected to a drain of transistor 110 and a drain connected to a source of transistor 160. Transistor 120 has a gate connected to the voltage reference PFET signal VREFP and a drain connected to a drain of transistor 130. Transistor 160 has a gate connected to the voltage reference PFET signal VREFP and a drain connected to a drain of transistor 170. Transistor 130 has a gate connected to the voltage reference NFET signal VREFN and a source connected to a drain of transistor 140. Transistor 170 has a gate connected to the voltage reference NFET signal VREFN and a source connected to a drain of transistor 180. Transistor 140 has a gate connected to the input signal IN and a source connected to the second supply voltage VSSO. Transistor 180 has a gate connected to a complementary input signal INB and a source connected to the second supply voltage VSSO.

In operation, the level shifter circuit 40 of FIG. 2 level shifts the input signal IN with a bias of the voltage reference NFET signal VREFN to output a level shifted NFET output signal LN_OUTPUT to the pre-driver circuit 50. Further, the level shifter circuit 40 level shifts the input signal IN with a bias of the voltage reference PFET VREFP to output a level shifted PFET output signal LP_OUTPUT to the pre-driver circuit 50.

The pre-driver circuit 50 of FIG. 2 receives the first supply voltage VDDO, the second supply voltage VSSO, the level shifted NFET output signal LN_OUTPUT, and the level shifted PFET output signal LP_OUTPUT. The pre-driver circuit 60 includes transistors 190, 200, 210, 220, 230, 240, 250, and 260 and delay circuits 290 and 300. The transistors 190, 200, 230, and 240 may be PFETs, while the transistors 210, 220, 250, and 260 may be NFETs, although embodiments are not limited to these implementations. In further embodiments, each of the delay circuits 290 and 300 may include one of a transistor and a resistor. although embodiments are not limited to this implementation. For example, in a non-limiting example, the delay circuit 290 may be a PFET and the delay circuit 300 may be a NFET.

In FIG. 2, the transistors 190 and 230 of the pre-driver circuit 50 each have a source which is connected to the first supply voltage VDDO. Transistor 190 has a gate connected to the delay circuit 290 and a drain connected to a source of transistor 200. Transistor 230 has a gate connected to the source of transistor 200 and a drain connected to a source of transistor 240. Transistor 200 has a gate connected to the voltage reference PFET signal VREFP and a drain connected to a drain of transistor 210. Transistor 240 has a gate connected to the voltage reference PFET signal VREFP and a drain connected to the drain of transistor 250. Transistor 210 has a gate connected to the voltage reference NFET signal VREFN and a source connected to a drain of transistor 220. Transistor 250 has a gate connected to the voltage reference NFET signal VREFN and a source connected to a drain of transistor 260. Transistor 220 has a gate connected to the drain of transistor 180 and a source connected to the second supply voltage VSSO. Transistor 260 has a gate connected to the delay circuit 300 and a source connected to the second supply voltage VSSO.

In operation, the delay circuit 290 of the pre-driver circuit 50 of FIG. 2 adjusts a duty cycle of the level shifted PFET output signal LP_OUTPUT to turn on the transistor 190 slower (i.e., delayed turning on the transistor 190) than if the delay circuit 290 was not included. Further, the delay circuit 300 of the pre-driver circuit 50 adjusts the duty cycle of the level shifted NFET output signal LN_OUTPUT to turn on the transistor 260 slower (i.e., delayed turning on the transistor 260) than if the delay circuit 300 was not included. The pre-driver circuit 50 outputs a pre-driver PFET output signal PDP_OUTPUT to the main driver circuit 60. Further, the pre-driver circuit 50 outputs a pre-driver NFET output signal PDN_OUTPUT to the switch circuit 310. The switch circuit 310 may be used to tristate the pre-driver NFET output signal PDN_OUTPUT and then sends a switch output signal SW_OUTPUT to the main driver circuit 60.

The main driver circuit 60 of FIG. 2 receives the first supply voltage VDDO, the second supply voltage VSSO, the pre-driver PFET output signal PDP_OUTPUT, and the switch output signal SW_OUTPUT. The main driver circuit 60 includes transistors 270 and 280. The transistor 270 may be a PFET, while the transistor 280 may be a NFET, although embodiments are not limited to these implementations.

In FIG. 2, the transistor 270 has a source which is connected to the first supply voltage VDDO, a gate connected to the pre-driver PFET output signal PDP_OUTPUT, and a drain connected to a drain of the transistor 280. Transistor 280 has a gate connected to the switch output signal SW_OUTPUT and a source connected to the second supply voltage VSSO.

In operation, the transistor 270 in the main driver circuit 60 receives a delayed pre-driver PFET output signal PDP_OUTPUT based on the delay circuit 290 adjusting the duty cycle of the level shifted PFET output signal LP_OUTPUT to turn on the transistor 190 slower (i.e., delayed turning on the transistor 190). Accordingly, there is a delay in turning on the transistor 270 in comparison to known circuits. Also, the transistor 280 receives a delayed switch output signal SW_OUTPUT based on the delay circuit 300 adjusting the duty cycle of the level shifted NFET output signal LN_OUTPUT to turn on the transistor 260 slower (i.e., delayed turning on the transistor 260). Accordingly, there is a delay in turning on the transistor 280 in comparison to known circuits. Thus, the delay in turning on transistors 270 and 280 results in a delayed rising edge of the main driver circuit output signal OUTPUT (i.e., at least one main driver output signal 70 in FIG. 1).

In the present disclosure, the circuit schematic 100 of FIG. 2 provides an output (i.e., the main driver circuit output signal OUTPUT) with a delayed rising edge due to the delay circuits 290, 300 (i.e., adjustment circuits) adjusting the duty cycle in a GPIO output buffer circuit using LDMOS devices. Further, the circuit schematic 100 of FIG. 2 in the present disclosure provides lower leakage and smaller area size than known circuits.

Figure 3:
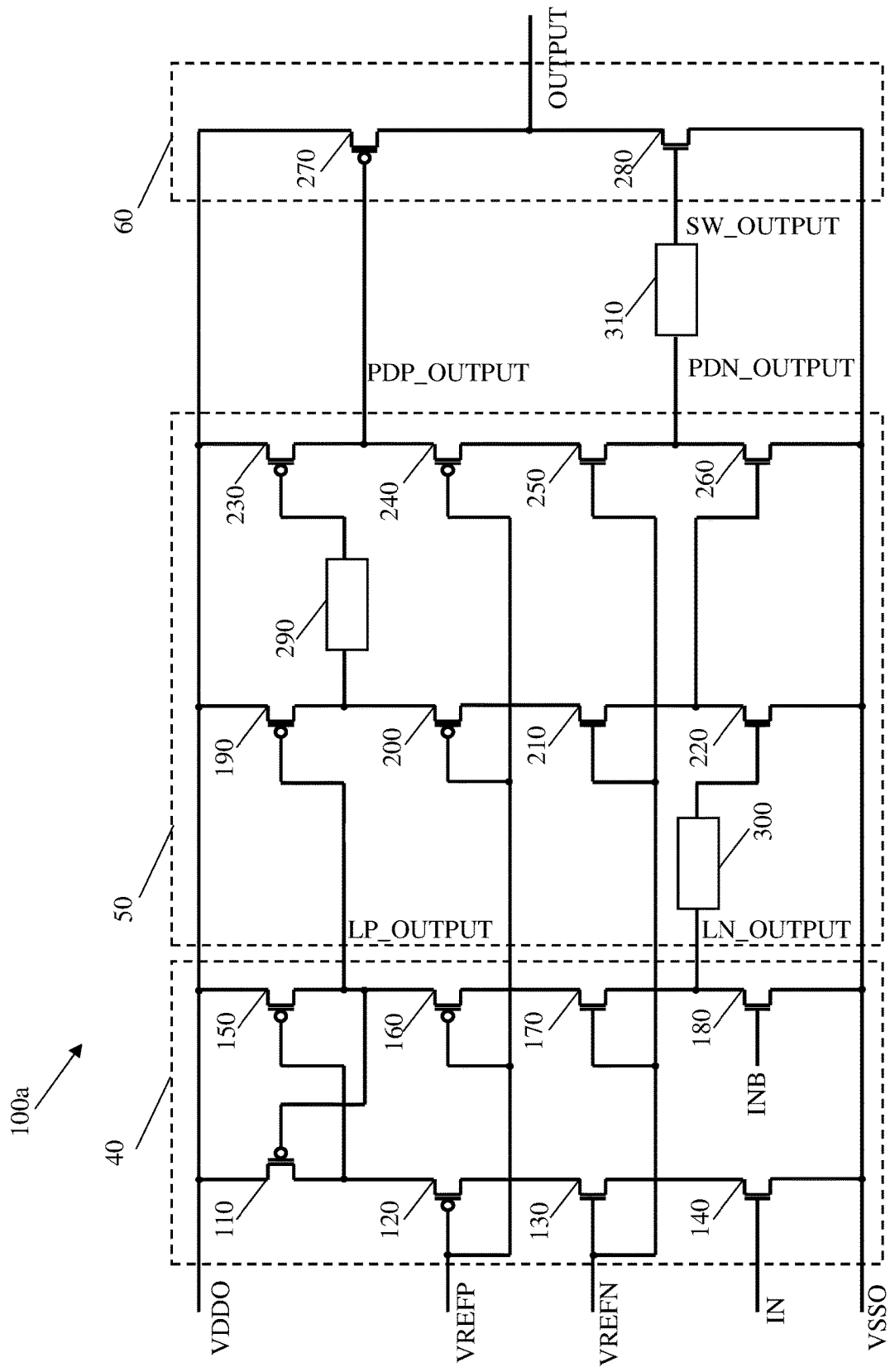
FIG. 3 shows another circuit schematic of the output buffer circuit in accordance with aspects of the present disclosure.

FIG. 3 shows another circuit schematic of the output buffer circuit in accordance with aspects of the present disclosure. The circuit schematic 100a of FIG. 3 is similar to FIG. 2 except for the placement of delay circuits 290 and 300. In particular, the delay circuit 290 in FIG. 3 is placed after the transistor 190 and is connected to the drain of transistor 190 and the gate of transistor 230. Further, the delay circuit 300 in FIG. 3 is placed before the transistor 220 and is connected to the gate of transistor 220 and to the drain of transistor 180. In FIG. 3, by changing the placement of delay circuits 290 and 300, the main driver circuit 60 outputs the main driver circuit output signal OUTPUT with a delayed falling edge. In contrast to FIG. 3, the main driver circuit output signal OUTPUT of FIG. 2 has a delayed rising edge (as discussed above with respect to FIG. 2).

Figure 4:
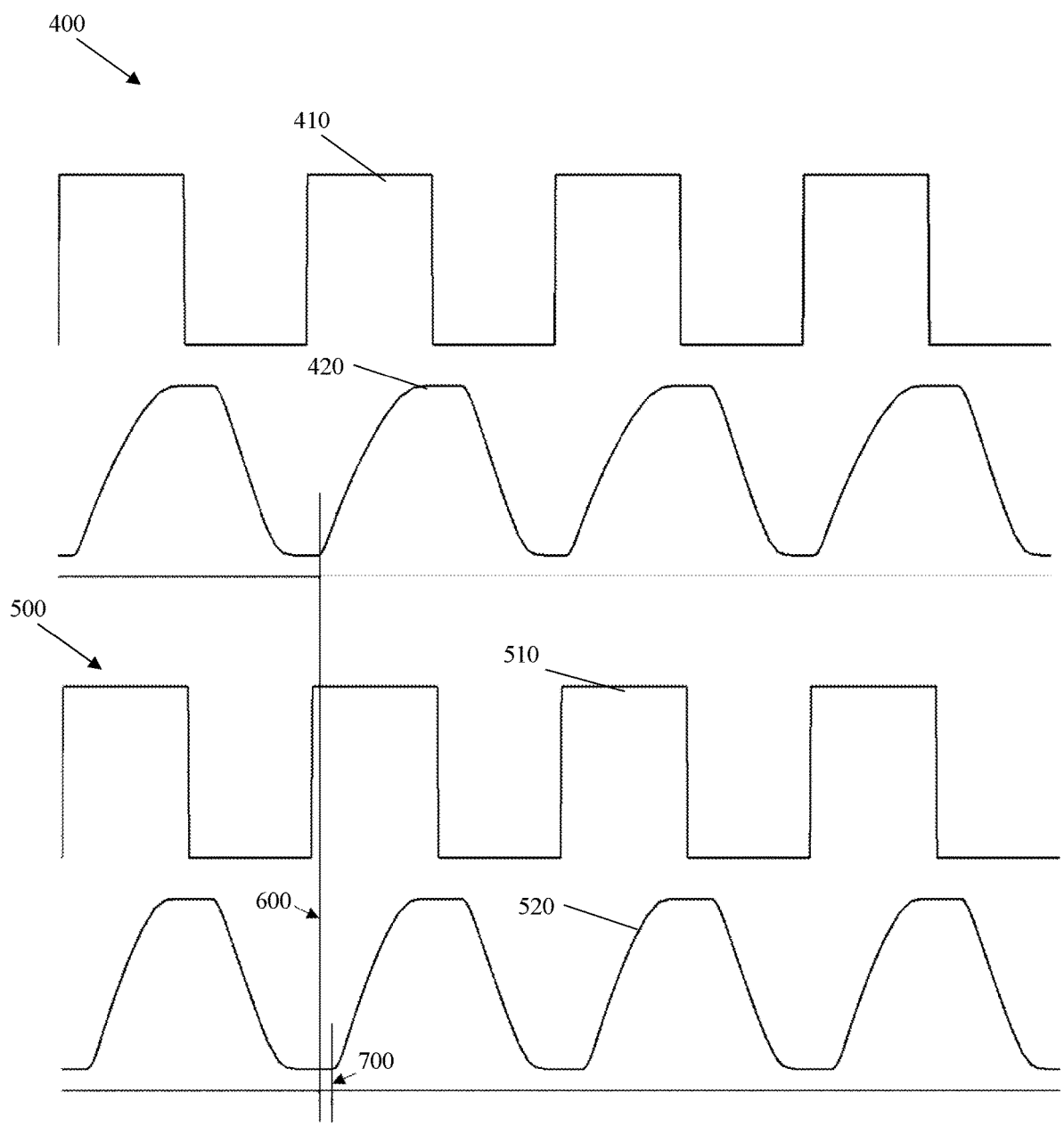
FIG. 4 shows graphs of the output buffer circuit of FIG. 2 in accordance with additional aspects of the present disclosure.

FIG. 4 shows graphs of the output buffer circuit of FIG. 2 in accordance with aspects of the present disclosure. In FIG. 4, graph 400 represents a known output buffer circuit which does not include any adjustment circuits (i.e., no delay circuits 290, 300). In particular, the graph 400 includes a known circuit input clock 410 and a known circuit output buffer circuit output with less desired duty cycle 420 (i.e., no adjusted duty cycle). Further, graph 500 represents the circuit schematic 100 of FIG. 2 which includes adjustments circuits (i.e., includes the delay circuits 290, 300). In particular, the graph 500 includes the circuit schematic input clock 510 and the circuit schematic output buffer circuit output with desired duty cycle 520.

In FIG. 4, the known circuit input clock 410 is the input of the output-driver. The known circuit output buffer circuit output with less desired duty cycle 420 is the output of the output-driver with bad or not desired duty cycle. A rising edge 700 of the output waveform is delayed by the adjustment circuits in comparison to a rising edge 600 of the original output of the known circuit output buffer circuit output with less desired duty cycle 420. Also, a time delay of the adjustment circuit may be adjusted to have an increased time delay or a smaller time delay by modifying the delay circuits 290 and 300 of the adjustment circuits. Further, a duty cycle of the circuit schematic 100a of FIG. 3 would have a delayed falling edge instead of the delayed rising edge in the circuit schematic 100 of FIG. 2.

The output buffer circuit may be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips may be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either surface interconnections and buried interconnections or both surface interconnections and buried interconnections). In any case the chip is then integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a level shifter circuit which receives an input signal and at least one voltage reference signal and outputs at least one level shifted output signal;
   a pre-driver circuit which receives the at least one level shifted output signal and outputs at least one pre-driver output signal, the pre-driver circuit comprising at least one delay circuit; and
   a main driver circuit which receives the at least one pre-driver output signal and outputs a main driver output signal, wherein:
   the level shifter circuit and the pre-driver circuit each comprises a first set a plurality of PFET devices and a plurality of NFET devices;
   at the level shifter circuit:
      a first PFET device receives a supply voltage signal at its source; and
      a second PFET device receives a voltage reference PFET signal of the at least one voltage reference signal at its gate; and
   the at least one delay circuit is connected between a drain of the first PFET device and a source of the second PFET device, wherein:
   the pre-driver circuit comprises a second set of transistors;
   the second set of transistors comprise a second set of a plurality of PFET devices and a plurality of NFET devices, and
   the plurality of PFET devices of the second set of transistors receive a level shifted PFET output signal of the at least one level shifted output signal, and the at least one delay circuit is connected between the drain of the first PFET device of the first set of the plurality of PFET devices of the pre-driver circuit and a gate of a first PFET device of the pre-driver circuit.

2. The structure of claim 1, wherein the plurality of NFET devices of the level shifter circuit and the pre-driver circuit receive a voltage reference NFET signal of the at least one voltage reference signal.

3. The structure of claim 1, wherein the plurality of NFET devices of the second set of transistors receive a level shifted NFET output signal of the at least one level shifted output signal.

4. The structure of claim 1, further comprising a switch circuit which receives a pre-driver NFET output signal and outputs a switch output signal.

5. The structure of claim 4, wherein the main driver circuit comprises a third set of transistors and receives a pre-driver PFET output signal of the at least one pre-driver output signal and the switch output signal.

6. The structure of claim 1, wherein the at least one delay circuit comprises a first transistor device and a second transistor device to delay a duty cycle of the main driver output signal.

7. A circuit comprising:
- a first set of transistors which receive an input signal and at least one voltage reference signal and outputs at least one level shifted output signal;
- a second set of transistors which receive one of the at least one level shifted output signal and outputs at least one pre-driver output signal;
- at least one delay circuit connected to a gate of a first device of the second set of transistors and between a drain and a source of adjacent devices of the first set of transistors; and
- a third set of transistors which receive one of the at least one pre-driver output signal and outputs a main driver output signal,
- wherein the at least one delay circuit comprises two delay circuits,
- a first delay circuit of the two delay circuits is connected between the drain of a first PFET device, a source of a second PFET device of the first set of transistors and a gate of a first PFET device of the second set of transistors, and
- a second delay circuit of the two delay circuits is connected between a drain of a first NFET device, a source of a second NFET device and a gate of a third NFET device of the second set of transistors.

8. The circuit of claim 7, wherein the first set of transistors comprise a plurality of PFET devices and a plurality of NFET devices, the first device and adjacent devices comprise PFET devices, and the at least one delay circuit is connected to a gate of a PFET device of the second set of transistors.

9. The circuit of claim 7, wherein the second set of transistors comprise a plurality of PFET devices and a plurality of NFET devices, the first device and adjacent devices comprise NFET devices, and the at least one delay circuit is connected to a gate of an NFET device of the second set of transistors.

10. The circuit of claim 7, wherein the third set of transistors comprise at least one PFET device and at least one NFET device.

11. The circuit of claim 7, wherein the at least one delay circuit comprises a first transistor device and a second transistor device to delay a duty cycle of the main driver output signal.

12. The circuit of claim 11, wherein the first transistor device comprises a PFET device and the second transistor device comprises a NFET device.

13. The circuit of claim 7, wherein the at least one delay circuit comprises a first resistor and a second resistor to delay a duty cycle of the main driver output signal.

14. A structure comprising:
- a level shifter circuit which receives an input signal and at least one voltage reference signal and outputs at least one level shifted output signal;
- a pre-driver circuit which receives the at least one level shifted output signal and outputs at least one pre-driver output signal, the pre-driver circuit comprising at least one delay circuit; and
- a main driver circuit which receives the at least one pre-driver output signal and outputs a main driver output signal, wherein:
- the level shifter circuit and the pre-driver circuit each comprises a first set a plurality of PFET devices and a plurality of NFET devices;
- at the level shifter circuit:
  - a first PFET device receives a supply voltage signal at its source; and
  - a second PFET device receives a voltage reference PFET signal of the at least one voltage reference signal at its gate; and
- the at least one delay circuit is connected between a drain of the first PFET device and a source of the second PFET device,
- wherein the at least one delay circuit comprises two delay circuits, a first delay circuit of the two delay circuits is connected between the drain of the first PFET device, a source of the second PFET device and a gate of a first PFET device of the pre-driver circuit, and a second delay circuit of the two delay circuits is connected between a drain of a first NFET device, a source of a second NFET device and a gate of a third NFET device of the pre-driver circuit.

* * * * *